(12) United States Patent
Yang et al.

(10) Patent No.: US 11,189,576 B2
(45) Date of Patent: Nov. 30, 2021

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Peng Yang, Kaohsiung (TW); Yuan-Feng Chiang, Kaohsiung (TW); Po-Wei Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 87 days.

(21) Appl. No.: 15/683,698

(22) Filed: Aug. 22, 2017

(65) Prior Publication Data

US 2018/0061776 A1    Mar. 1, 2018

Related U.S. Application Data

(60) Provisional application No. 62/379,153, filed on Aug. 24, 2016.

(51) Int. Cl.
*H01L 23/00* (2006.01)
*H01L 23/16* (2006.01)
(Continued)

(52) U.S. Cl.
CPC ........ *H01L 23/562* (2013.01); *H01L 21/4853* (2013.01); *H01L 21/4857* (2013.01); *H01L 21/561* (2013.01); *H01L 21/565* (2013.01); *H01L 23/16* (2013.01); *H01L 23/3114* (2013.01); *H01L 23/3135* (2013.01); *H01L 23/5383* (2013.01); *H01L 23/5386* (2013.01); *H01L 23/5389* (2013.01); *H01L 24/96* (2013.01); *H01L 21/568* (2013.01); *H01L 2224/04105* (2013.01); *H01L 2224/12105* (2013.01); *H01L 2224/18* (2013.01); *H01L 2224/73267* (2013.01);
(Continued)

(58) Field of Classification Search
CPC ............ H01L 23/3114; H01L 23/3135; H01L 23/562; H01L 23/16; H01L 23/5389; H01L 2924/15156; H01L 2924/1815; H01L 2924/18162; H01L 2224/92244; H01L 2224/73267; H01L 2224/18; H01L 2224/04105; H01L 2224/12105
See application file for complete search history.

(56) References Cited

U.S. PATENT DOCUMENTS 6,586,822 B1 * 7/2003 Vu ................ H01L 23/532
                                                257/678
6,709,898 B1   3/2004 Ma et al.
(Continued)

FOREIGN PATENT DOCUMENTS

CN    103887251 A    6/2014
CN    105448752 A    3/2016

*Primary Examiner* — Marcos D. Pizarro
*Assistant Examiner* — Antonio B Crite
(74) *Attorney, Agent, or Firm* — Foley & Lardner LLP

(57) ABSTRACT

A semiconductor device package comprises a semiconductor device, a first encapsulant surrounding the semiconductor device, a second encapsulant covering the semiconductor (Continued)

device and the first encapsulant, and a redistribution layer extending through the second encapsulant and electrically connected to the semiconductor device.

17 Claims, 16 Drawing Sheets

(51) Int. Cl.
*H01L 23/31* (2006.01)
*H01L 23/538* (2006.01)
*H01L 21/48* (2006.01)
*H01L 21/56* (2006.01)

(52) U.S. Cl.
CPC ............... *H01L 2224/92244* (2013.01); *H01L 2224/95001* (2013.01); *H01L 2924/1431* (2013.01); *H01L 2924/1433* (2013.01); *H01L 2924/15156* (2013.01); *H01L 2924/1815* (2013.01); *H01L 2924/18162* (2013.01); *H01L 2924/351* (2013.01); *H01L 2924/3511* (2013.01)

(56) References Cited

U.S. PATENT DOCUMENTS

| | | | |
|---|---|---|---|
| 8,618,652 B2* | 12/2013 | Nalla | H01L 21/02109 257/700 |
| 9,640,498 B1* | 5/2017 | Huang | H01L 23/3157 |
| 2007/0273019 A1 | 11/2007 | Huang et al. | |
| 2010/0184256 A1* | 7/2010 | Chino | H01L 23/488 438/118 |
| 2011/0018123 A1* | 1/2011 | An | H01L 24/19 257/693 |
| 2011/0140267 A1* | 6/2011 | Tsai | H01L 23/13 257/737 |
| 2013/0010441 A1* | 1/2013 | Oganesian | H01L 24/24 361/752 |
| 2015/0035164 A1* | 2/2015 | Ma | H01L 23/3135 257/774 |
| 2015/0108667 A1* | 4/2015 | Lai | H01L 21/565 257/787 |
| 2016/0079110 A1 | 3/2016 | Chuang et al. | |
| 2016/0133556 A1* | 5/2016 | Chiang | H01L 24/97 257/698 |

\* cited by examiner

SEMICONDUCTOR DEVICE PACKAGE AND A METHOD OF MANUFACTURING THE SAME

CROSS-REFERENCE TO RELATED APPLICATION

This application claims the benefit of and priority to U.S. Provisional Application No. 62/379,153, filed Aug. 24, 2016, the content of which is incorporated herein by reference in its entirety.

BACKGROUND

1. Technical Field

The present disclosure relates to a semiconductor device package. More particularly, the present disclosure relates to a semiconductor device package including an encapsulant surrounding a semiconductor device and another encapsulant covering the semiconductor device and the former encapsulant.

2. Description of the Related Art

A semiconductor device is typically attached to a carrier (e.g., a substrate, a lead frame, and so forth) and molded by an encapsulant to form a semiconductor device package. However, warpage phenomenon, die-shifting phenomenon or other problems may cause reliability issues.

SUMMARY

In some embodiments, according to one aspect, a semiconductor device package comprises a semiconductor device, a first encapsulant surrounding the semiconductor device, a second encapsulant covering the semiconductor device and the first encapsulant, and a redistribution layer extending through the second encapsulant and electrically connected to the semiconductor device.

In some embodiments, according to another aspect, a method is disclosed for manufacturing a semiconductor device package. The method comprises: providing a first encapsulant defining a cavity; disposing a semiconductor device in the cavity; forming a second encapsulant and over the cavity to cover the semiconductor device and the first encapsulant; and forming a redistribution layer electrically connected to the semiconductor device.

DETAILED DESCRIPTION

Figure 1:
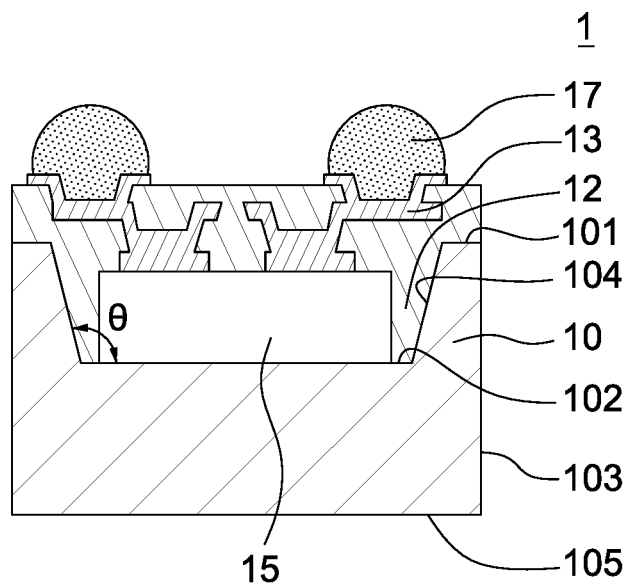
FIG. 1 illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 is a cross-sectional view of a semiconductor device package 1 in accordance with some embodiments of the present disclosure. The semiconductor device package 1 includes an encapsulant 10, a semiconductor device 15, another encapsulant 12, a redistribution layer 13, and a connection element 17.

The encapsulant 10 includes a surface (or top surface) 101, a surface (or cavity bottom surface) 102, a surface (or bottom surface) 105, a lateral surface 103, and a sidewall (or cavity sidewall) 104.

The surface 101 is opposite to the surface 105. The surface 101 is opposite to the surface 102. The lateral surface 103 extends between the surface 101 and the surface 105. The sidewall 104 extends between the surface 101 and the surface 102. In some embodiments, a roughness of the lateral surface 113 is greater than a roughness of the bottom surface 112.

The sidewall 104 and the surface 102 define a space or cavity to accommodate or receive the semiconductor device 15 and the encapsulant 12. The sidewall 104 may be tapered from the surface 101 to the surface 102. The sidewall 104 and the surface 102 form an angle (θ) which is an obtuse angle in a range from approximately 91° to approximately 125° or from approximately 91° to approximately 115°. The sidewall 104 and a bottom surface (or backside) of the semiconductor device 15 also form the angle (θ) which is an obtuse angle in a range from approximately 91° to approximately 125° or from approximately 91° to approximately 115°. In some embodiments, the encapsulant 10 may include a polyimide, a molding compound, a ceramic material, a conductive material, a metallic alloy, or other suitable materials.

The encapsulant 12 fills the cavity. The encapsulant 12 covers the cavity. The encapsulant 12 encapsulates or covers the semiconductor device 15. The encapsulant 12 also covers the encapsulant 10. In some embodiments, the encapsulant 12 may function as a planarization layer. The encapsulant 12 may include a polyimide, a dielectric material or other suitable materials. The sidewall 104 of the encapsulant 10 surrounds a portion of the encapsulant 12 disposed in the cavity. In some embodiments, a material of the encapsulant 10 may be the same as a material of the encapsulant 12. The material of the encapsulant 10 may be different from the material of the encapsulant 12.

The sidewall 104 of the encapsulant 10 surrounds the semiconductor device 15. The surface 101 is higher than a top surface (or active side) of the semiconductor device 15. In some embodiments, the semiconductor device 15 may include an application-specific integrated circuit (ASIC), a controller, a processor or other electronic component or semiconductor device.

The redistribution layer 13 is disposed at least partially within the encapsulant 12. The redistribution layer 13 is disposed on a portion of the encapsulant 12. The redistribution layer 13 is surrounded by the encapsulant 12. The redistribution layer 13 is electrically connected to the semiconductor device 15. In some embodiments, the redistribution layer 13 includes a patterned conductive layer. The redistribution layer 13 includes conductive traces, pads and vias.

The connection element 17 is disposed on the redistribution layer 13. The connection element 17 is electrically connected to the semiconductor device 15. In some embodiments, the connection element 17 may be a solder ball, a solder paste, a joint material, or other suitable materials.

Figure 2:
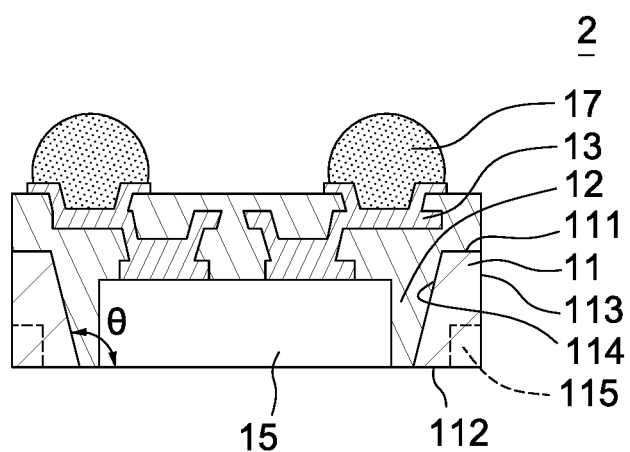
FIG. 2 illustrates a cross-sectional view of a semiconductor device package according to some embodiments of the present disclosure.

FIG. 2 is a cross-sectional view of a semiconductor device package 2 in accordance with some embodiments of the present disclosure. The semiconductor device package 2 includes an encapsulant 11, a semiconductor device 15, another encapsulant 12, a redistribution layer 13, and a connection element 17. The depicted structure of FIG. 2 is similar to the structure depicted in FIG. 1, except that the encapsulant 10 depicted in FIG. 1 is replaced with the encapsulant 11.

The encapsulant 11 includes a surface (or top surface) 111, a surface (or bottom surface) 112, a lateral surface 113, and a sidewall (or cavity sidewall) 114. The encapsulant 11 includes corner portions 115. The surface 111 is opposite to the surface 112. The surface 112 is substantially perpendicular to the lateral surface 113. In some embodiments, the bottom surface 112 of the encapsulant 11 is grinded. In some embodiments, a roughness of the bottom surface 112 may be greater than a roughness of the lateral surface 113. The roughness of the lateral surface 113 also may be greater than the roughness of the bottom surface 112. The encapsulant 11 defines a cavity. In some embodiments, the encapsulant 11 may comprise a polyimide, a molding compound, a ceramic material, a conductive material, a metallic alloy, or other suitable materials.

The encapsulant 12 includes a bottom surface. The sidewall 114 of the encapsulant 11 and the bottom surface of the encapsulant 12 define a space or cavity to accommodate or receive the semiconductor device 15. The sidewall 114 may be tapered from the surface 111 to the surface 112. The sidewall 114 and the bottom surface of the encapsulant 12 form an angle (θ) which is an obtuse angle in a range from approximately 91° to approximately 125° or from approximately 91° to approximately 115°. The encapsulant 12 fills the cavity. The encapsulant 12 covers the cavity. The encapsulant 12 encapsulates the semiconductor device 15 and the encapsulant 11. In some embodiments, the encapsulant 12 may function as a planarization layer. The encapsulant 12 may include a polyimide, a dielectric material or other suitable materials. The sidewall 114 of the encapsulant 11 surrounds a portion of the encapsulant 12 disposed in the cavity. In some embodiments, a material of the encapsulant 11 may be the same as a material of the encapsulant 12. The material of the encapsulant 11 may be different from the material of the encapsulant 12.

A bottom surface (or backside) of the semiconductor device 15 is exposed by the encapsulant 12. A height of the encapsulant 11 is higher than a height of the semiconductor device 15. The tapered sidewall 114 of the encapsulant 11 surrounds the semiconductor device 15. In some embodiments, the semiconductor device 15 may include an ASIC, a controller, a processor or other electronic component or semiconductor device.

The redistribution layer 13 is disposed at least partially within the encapsulant 12. The redistribution layer 13 is disposed on a portion of the encapsulant 12. The redistribution layer 13 is surrounded by the encapsulant 12. The redistribution layer 13 is electrically connected to the semiconductor device 15. In some embodiments, the redistribution layer 13 includes a patterned conductive layer. The redistribution layer 13 includes conductive traces, pads and vias.

The connection element 17 is disposed on the redistribution layer 13. The connection element 17 is electrically connected to the semiconductor device 15. In some embodiments, the connection element 17 may be a solder ball, a solder paste, a joint material, or other suitable materials.

Figure 3:
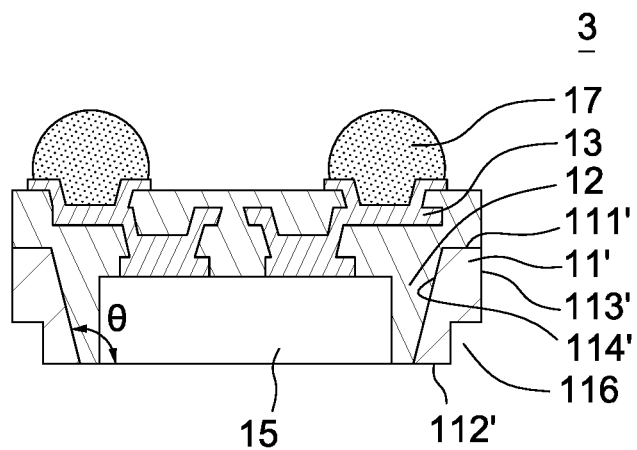
FIG. 3 illustrates a cross-sectional view of a semiconductor device package according to some embodiments of the present disclosure.

FIG. 3 is a cross-sectional view of a semiconductor device package 3 in accordance with some embodiments of the present disclosure. The semiconductor device package 3 includes an encapsulant 11', a semiconductor device 15, another encapsulant 12, a redistribution layer 13, and a connection element 17. The depicted structure of FIG. 3 is similar to the structure depicted in FIG. 2, except that the corner portions 115 of the encapsulant 11 depicted in FIG. 2 are removed from the structure depicted in FIG. 3 so as to form recesses 116. The third encapsulant 11' comprises a step structure.

During a singulation operation, the encapsulant 11' is cut with a saw. The structure of the encapsulant 11' may reduce the consumption or degradation of the saw during the singulation operation because the singulated portion is reduced in the structure of the encapsulant 11'.

FIG. 4A through FIG. 4G illustrate some embodiments of a method of manufacturing the semiconductor device package 1 or the semiconductor device package 2 according to some embodiments of the present disclosure.

Figure 4A:
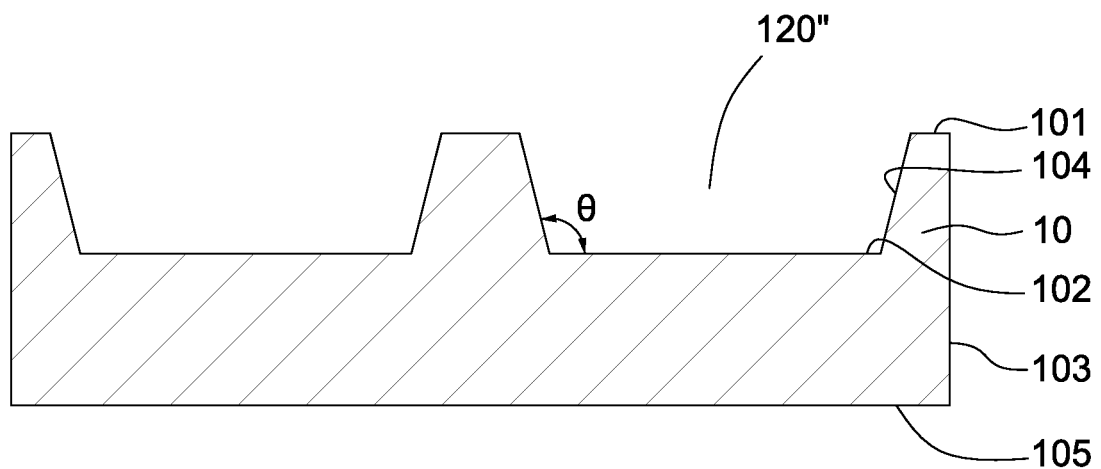
FIG. 4A illustrates a method of manufacturing a semiconductor device package according to some embodiments of the present disclosure.

Referring to FIG. 4A, the method includes providing the encapsulant 10. In some embodiments, the encapsulant 10 is pre-designed with a particular specification.

The encapsulant 10 includes the surface 101, the surface 102, the surface 105, the lateral surface 103, and the sidewall 104. The sidewall 104 extends from the surface 101 to the surface 102. The sidewall 104 and the surface 102 form an angle (θ) which is in a range from approximately 91° to approximately 125° or from approximately 91° to approximately 115°. The sidewall 104 and the surface 102 define a cavity 120".

Figure 4B:
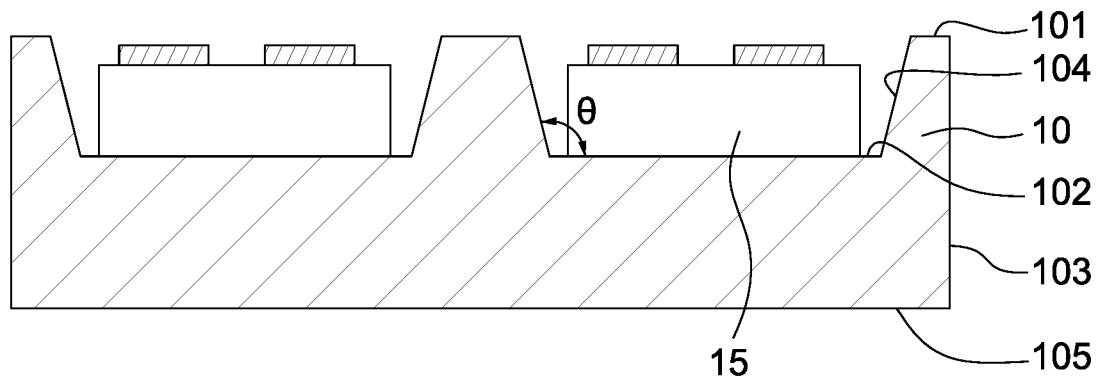
FIG. 4B illustrates a method of manufacturing a semiconductor device package according to some embodiments of the present disclosure.

Referring to FIG. 4B, the semiconductor device 15 is disposed in the cavity 120" of the encapsulant 10. The semiconductor device 15 is disposed on the surface 102 of the encapsulant 10. While disposing the semiconductor device 15 on the surface 102 of the encapsulant 10, the tapered sidewall 104 may help to guide the semiconductor device 15 to the surface 102 to avoid a misalignment or die-shift issue. The semiconductor device 15 may be directly disposed on the surface 102.

Figure 4C:
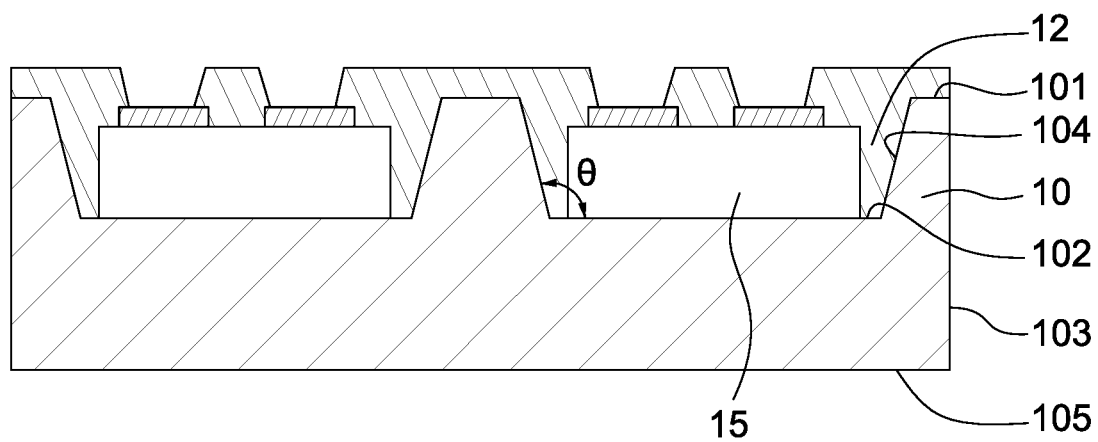
FIG. 4C illustrates a method of manufacturing a semiconductor device package according to some embodiments of the present disclosure.

Referring to FIG. 4C, the encapsulant 12 is disposed or formed in and over the cavity 120" to cover the encapsulant 10 and the semiconductor device 15. The encapsulant 12 may function as a planarization layer. The quantity of the encapsulant 12 is relatively less and a warpage issue here is mitigated. Conductive pads of the semiconductor device 15 are exposed by the encapsulant 12. The conductive pads of the semiconductor device 15 are exposed by the encapsulant 12 via, for example but not limited to, a photolithography technique. The conductive pads of the semiconductor device 15 are exposed by the encapsulant 12 via, for example but not limited to, a grinding technique.

Figure 4D:
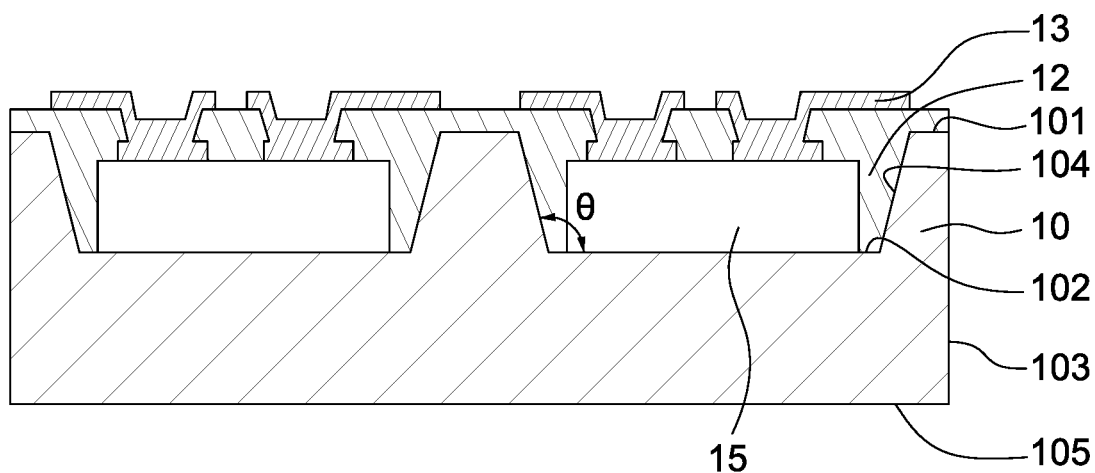
FIG. 4D illustrates a method of manufacturing a semiconductor device package according to some embodiments of the present disclosure.

Referring to FIG. 4D, the redistribution layer 13 is formed on the encapsulant 12.

Figure 4E:
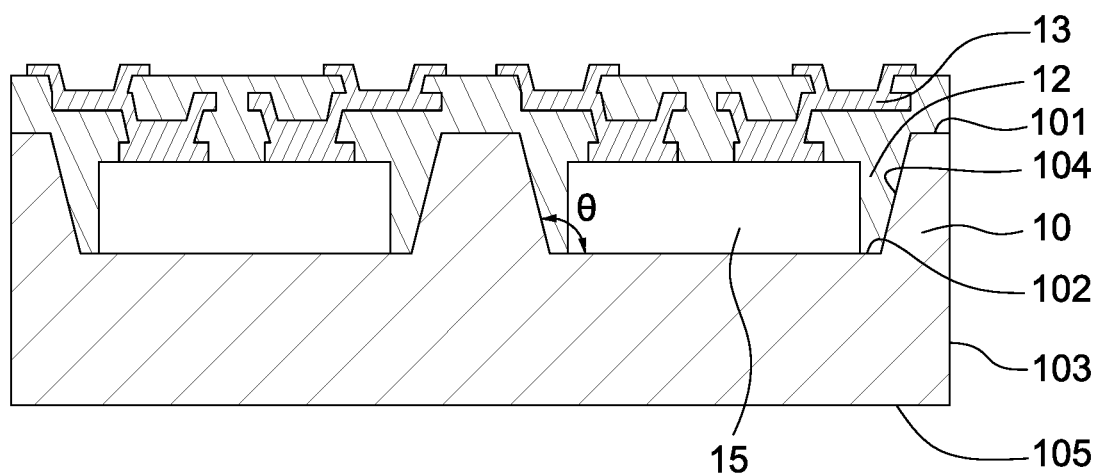
FIG. 4E illustrates a method of manufacturing a semiconductor device package according to some embodiments of the present disclosure.

Referring to FIG. 4E, an additional portion of the encapsulant 12 is further disposed or formed on the redistribution layer 13 and covers the redistribution layer 13. The additional portion of the encapsulant 12 is patterned to expose the redistribution layer 13. An additional redistribution layer 13 is further formed on the additional portion of the encapsulant 12. The redistribution layer 13 is surrounded by the encapsulant 12. The redistribution layer 13 is electrically connected to the semiconductor device 15.

Figure 4F:
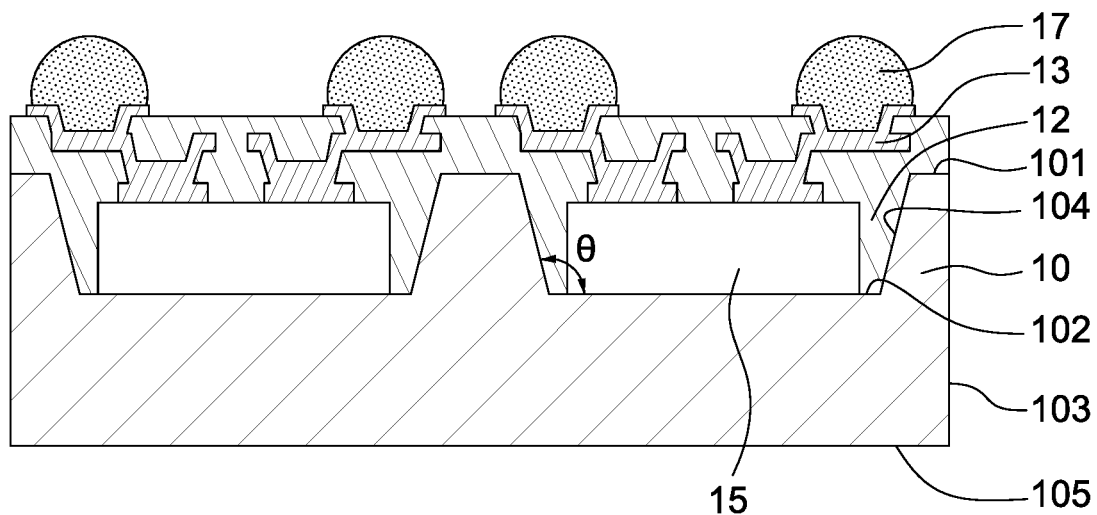
FIG. 4F illustrates a method of manufacturing a semiconductor device package according to some embodiments of the present disclosure.

Referring to FIG. 4F, the connection element 17 is disposed on the redistribution layer 13. The connection element 17 is electrically connected to the semiconductor device 15.

The semiconductor device package 1 depicted in FIG. 1 is then formed if the structure depicted in FIG. 4F is singulated by a singulation operation.

Figure 4G:
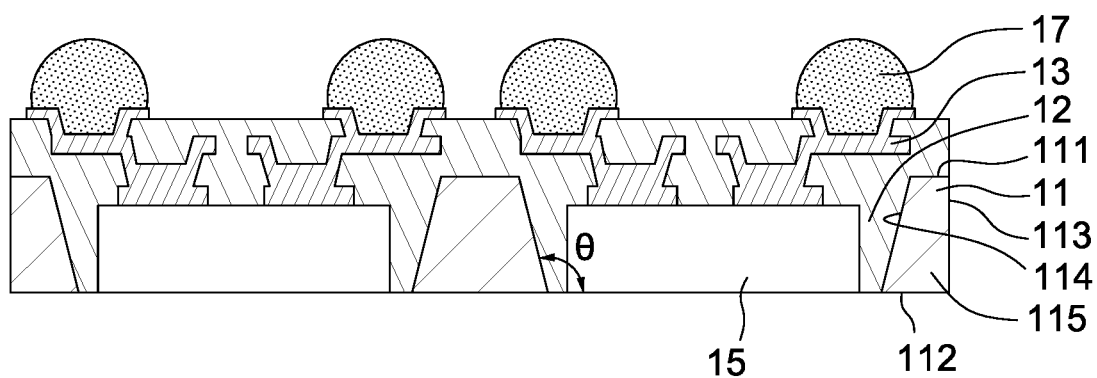
FIG. 4G illustrates a method of manufacturing a semiconductor device package according to some embodiments of the present disclosure.

Referring to FIG. 4G, the encapsulant 10 is grinded by a grinding operation to form the encapsulant 11. A roughness of the bottom surface 112 of the encapsulant 11 may be greater than a roughness of the lateral surface 113 of the encapsulant 11. The semiconductor device 15 is exposed by the encapsulant 11.

The semiconductor device package 2 depicted in FIG. 2 is then formed if the structure depicted in FIG. 4G is singulated by a singulation operation.

FIG. 5A and FIG. 5D through FIG. 5H illustrate some embodiments of a method of manufacturing the semiconductor device package 2 according to some embodiments of the present disclosure.

Figure 5A:
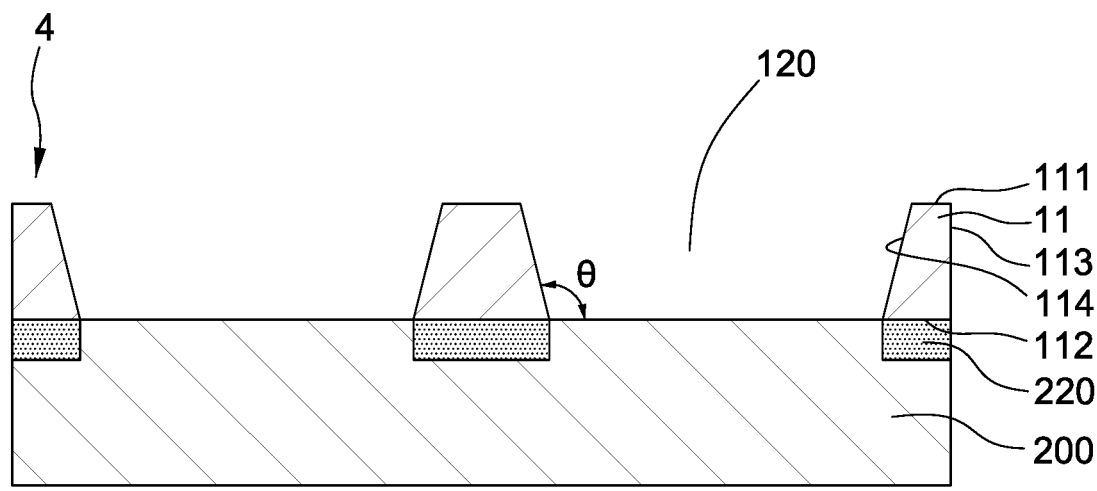
FIG. 5A illustrates a method of manufacturing a semiconductor device package according to some embodiments of the present disclosure.
Figure 5B:
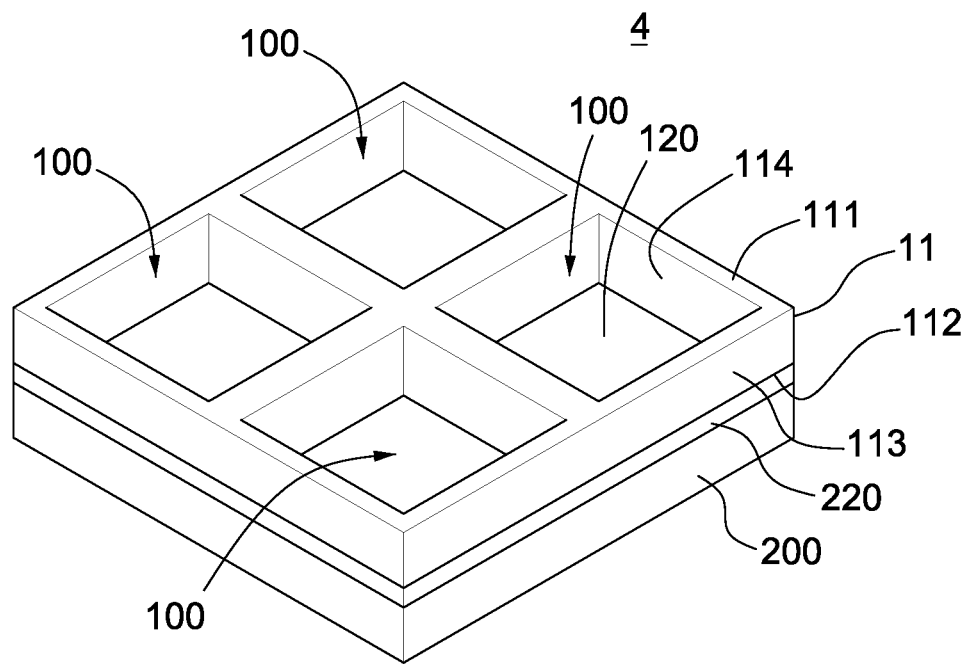
FIG. 5B illustrates a perspective view of a substrate array according to some embodiments of the present disclosure.

Referring to FIG. 5A, the method includes providing a substrate array 4. The substrate array 4 includes a portion including an encapsulant and a portion including a release layer with a carrier. The substrate array 4 includes a plurality of substrates 100 (as shown in FIG. 5B). Each substrate 100 includes an encapsulant 11, a release layer 220, and a carrier 200. The encapsulant 11 is attached to the carrier 200 via the release layer 220. The release layer 220 is covered by the encapsulant 11. The carrier 200 serves to support the encapsulant 11. In some embodiments, a plurality of the encapsulants 11 of the substrates 100 can be pre-designed or pre-molded. The carrier 200 may be recyclable. The volume of the encapsulant 11 can be designed as a minimum or reduced volume to reduce manufacturing cost.

The encapsulant 11 includes the surface 111, the surface 112, the lateral surface 113, and the sidewall 114. In some embodiments, the bottom surface 112 of the encapsulant 11 may be grinded. The bottom surface 112 of the encapsulant 11 may not be grinded. The encapsulant 11 defines a cavity 120. The sidewall 114 of the encapsulant 11 and a top surface of the carrier 200 define the cavity or space 120. The sidewall 114 may be tapered from the surface 111 to the surface 112. The tapered sidewall 114 of the encapsulant 11 and the top surface of the carrier 200 form an angle (θ) which is in a range from approximately 91° to approximately 125° or from approximately 91° to approximately 115°.

FIG. 5B illustrates a perspective view of the substrate array 4 according to some embodiments of the present disclosure. The substrate array 4 includes the plurality of substrates 100. The encapsulant portion of the substrate array 4 has a grid pattern. The release layer portion of the substrate array 4 has a grid pattern. Each substrate 100 includes the encapsulant 11, the release layer 220, and the carrier 200. The encapsulant 11 is attached to the carrier 200 via the release layer 220. In some embodiments, the encapsulant 11 may include a polyimide, a molding compound, a ceramic material, a conductive material, a metallic alloy, or other suitable materials. In some embodiments, the release layer 220 may be a thermal release film or an ultraviolet (UV) light release film. The release layer 220 may be a tape, a glue, or an adhesive.

Figure 5C:
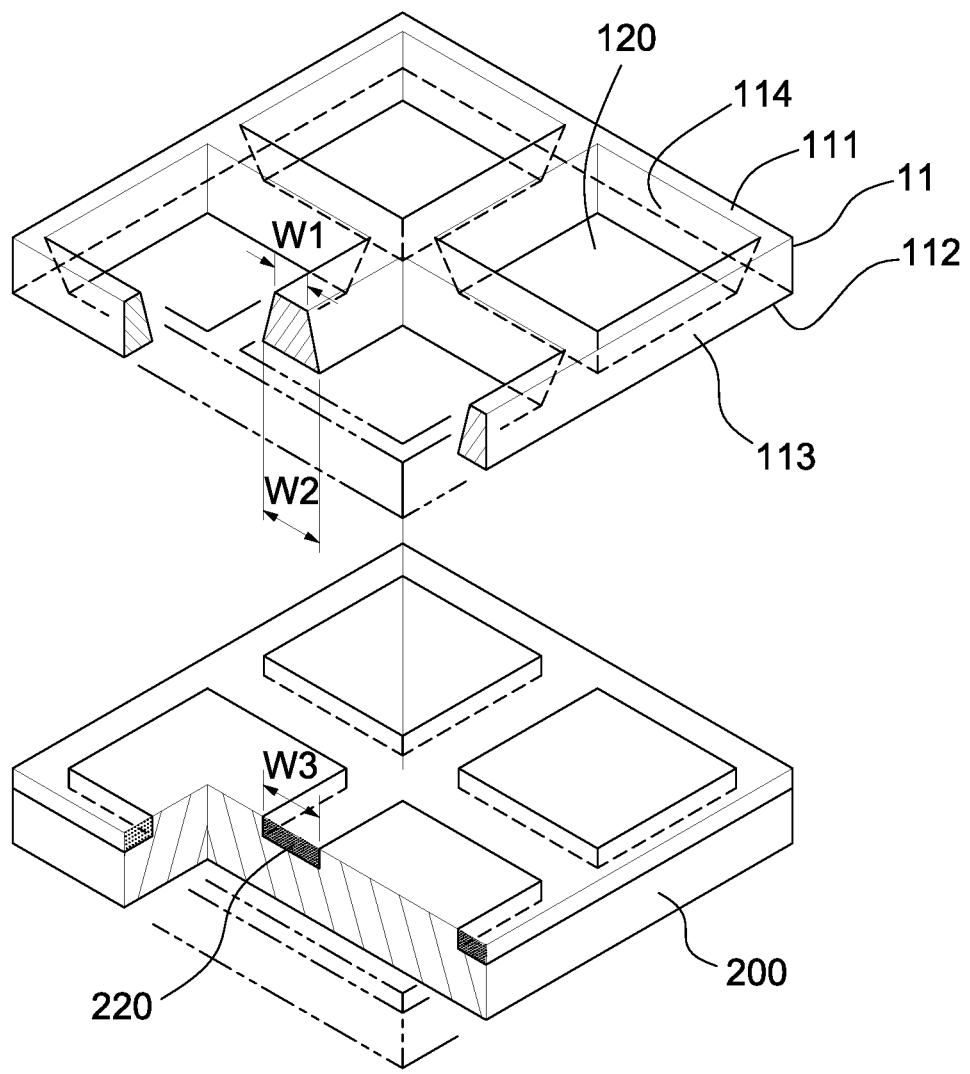
FIG. 5C illustrates an exploded perspective view of a substrate array according to some embodiments of the present disclosure.

FIG. 5C illustrates an exploded perspective view of the substrate array 4 according to some embodiments of the present disclosure. The substrate array 4 is divided into the encapsulant portion and the release layer portion with the carrier 200. The release layer 220 is embedded in the carrier 200.

For the encapsulant 11 of the substrate 100, the surface 111 of the encapsulant 11 has a width W1 (corresponding to a top line width of the grid pattern of the encapsulant portion). The surface 112 of the encapsulant 11 has a width W2 (corresponding to a bottom line width of the grid pattern of the encapsulant portion). The width W2 is larger than the width W1. The release layer 220 is embedded in the carrier 200. The release layer 220 has a width W3 (corresponding to a line width of the grid pattern of the release layer portion). In some embodiments, the width W3 may be less than the width W2. The width W3 may be substantially equal to the width W2.

Figure 5D:
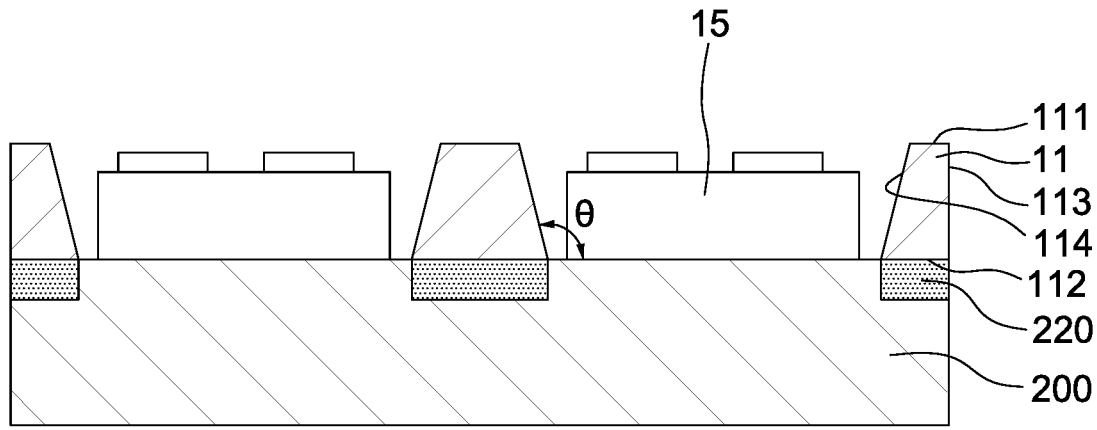
FIG. 5D illustrates a method of manufacturing a semiconductor device package according to some embodiments of the present disclosure.

Referring to FIG. 5D, the semiconductor device 15 is disposed in the cavity 120 of the encapsulant 11. While disposing the semiconductor device 15 on the top surface of the carrier 200, the tapered sidewall 114 may help to guide the semiconductor device 15 to the top surface of the carrier 200 to avoid a misalignment or die-shift issue. The semiconductor device 15 can be directly disposed on the top surface of the carrier 200.

Figure 5E:
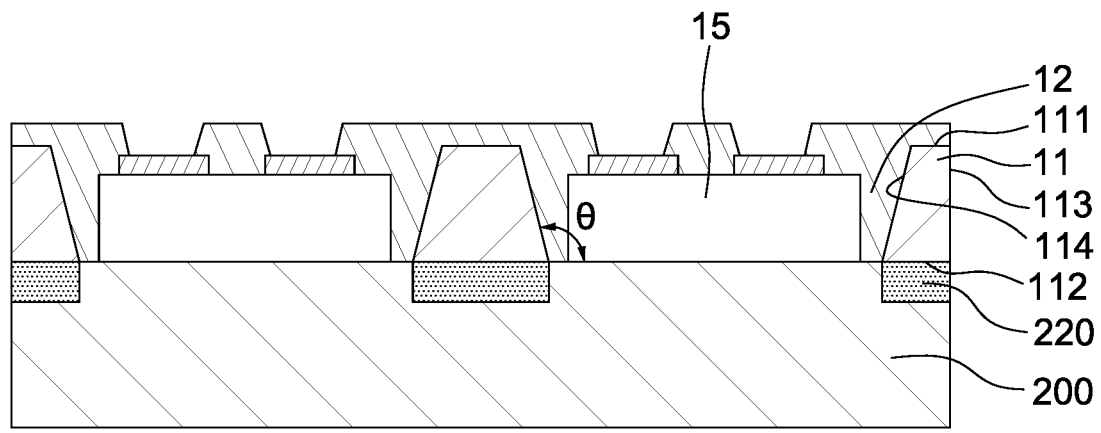
FIG. 5E illustrates a method of manufacturing a semiconductor device package according to some embodiments of the present disclosure.
Figure 5F:
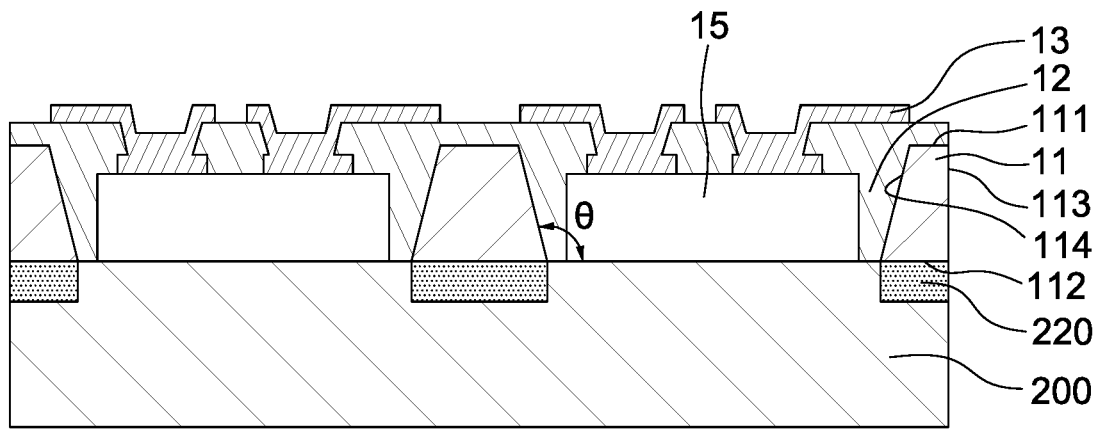
FIG. 5F illustrates a method of manufacturing a semiconductor device package according to some embodiments of the present disclosure.
Figure 5G:
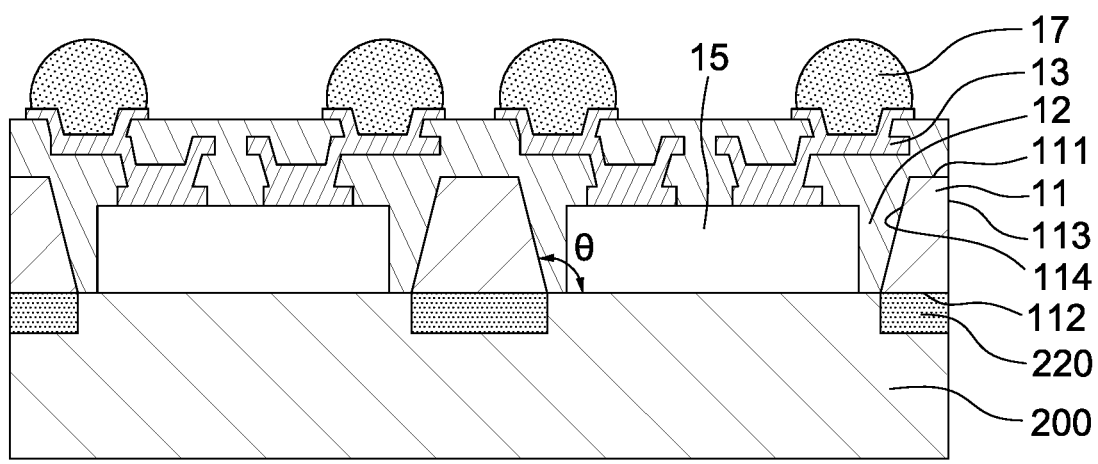
FIG. 5G illustrates a method of manufacturing a semiconductor device package according to some embodiments of the present disclosure.

Referring to FIG. 5E through FIG. 5G, the depicted operations are similar to the operations of FIG. 4C through FIG. 4F. Referring to FIG. 5E, the encapsulant 12 is disposed or formed in and over the cavity 120 to cover the encapsulant 11 and the semiconductor device 15. The encapsulant 12 may function as a planarization layer. The quantity of the encapsulant 12 can be controlled as a relatively lesser quantity. In some embodiments, material characteristics of the encapsulant 11 can be relatively hard, as compared to, for example, the encapsulant 12. The encapsulant 11 may comprise a molding compound with a relatively higher amount of fillers. The encapsulant 11 may comprise a polyimide. The warpage issue can be mitigated because the encapsulant 11 can be relatively hard and the quantity of the encapsulant 12 formed in the cavity 120 is relatively less. In some embodiments, the encapsulant 12 may comprise a polyimide. The substrate 100 can act as a mold chase. Accordingly, another mold chase may be omitted. Since the encapsulant 11 may comprise a molding compound with a relatively high amount of fillers and the encapsulant 11 can be relatively hard, a rigidity of the encapsulant 11 is sufficient high to support the encapsulant 12 so as to enhance the rigidity of the whole package.

Referring to FIG. 5F, the redistribution layer 13 is formed on the encapsulant 12.

Referring to FIG. 5G, an additional portion of the encapsulant 12 is further formed on the redistribution layer 13 and covers the redistribution layer 13. Then, the additional portion of the encapsulant 12 is patterned to expose the redistribution layer 13. An additional redistribution layer 13 is further formed on the encapsulant 12. The redistribution layer 13 is surrounded by the encapsulant 12. The connection element 17 is disposed on the redistribution layer 13. The redistribution layer 13 is electrically connected to the semiconductor device 15. The connection element 17 is electrically connected to the semiconductor device 15.

Figure 5H:
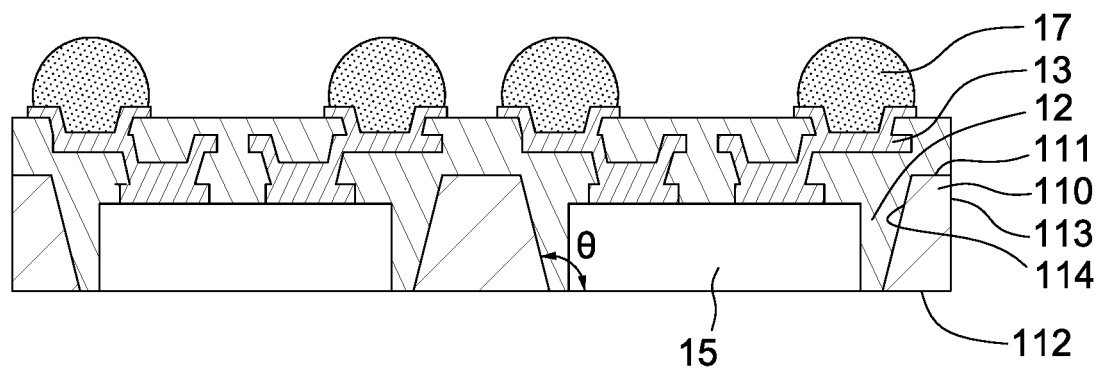
FIG. 5H illustrates a method of manufacturing a semiconductor device package according to some embodiments of the present disclosure.

Referring to FIG. 5H, the release layer 220 and the carrier 200 are removed.

The semiconductor device package 2 depicted in FIG. 2 is then formed if the structure depicted in FIG. 5H is singulated by a singulation operation.

FIG. 6A and FIG. 6D through FIG. 6H illustrate some embodiments of a method of manufacturing the semiconductor device package 3 according to some embodiments of the present disclosure.

Figure 6A:
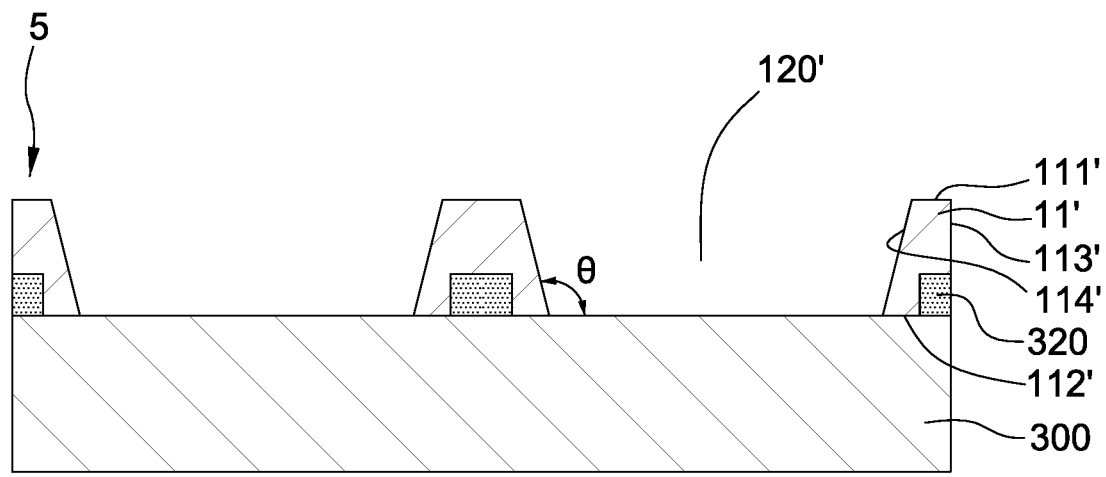
FIG. 6A illustrates a method of manufacturing a semiconductor device package according to some embodiments of the present disclosure.
Figure 6B:
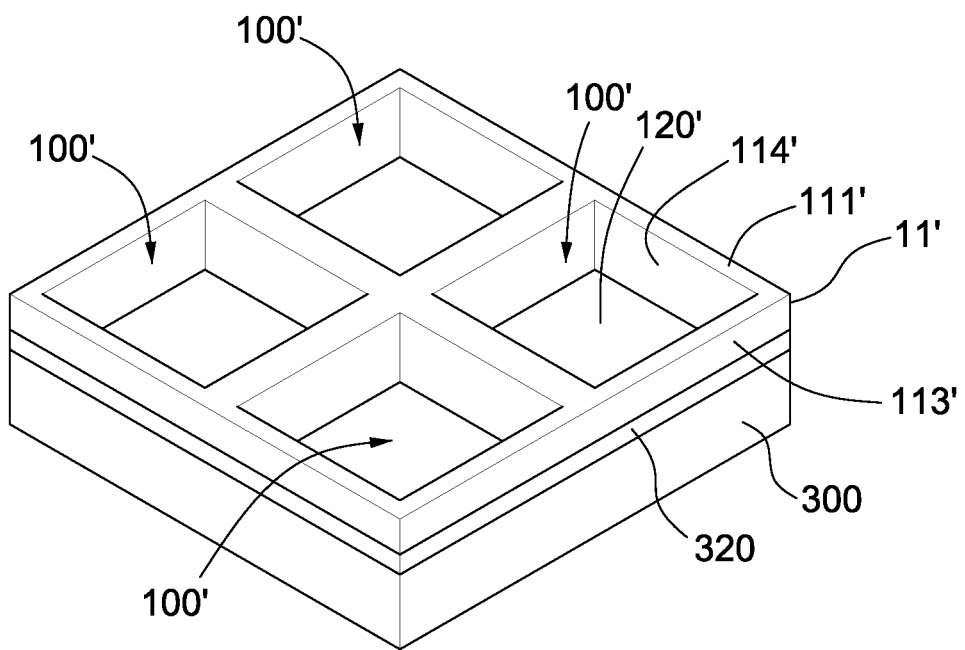
FIG. 6B illustrates a perspective view of a substrate array according to some embodiments of the present disclosure.

Referring to FIG. 6A, the method includes providing a substrate array 5. The substrate array 5 includes a portion including an encapsulant and a portion including a release layer with a carrier. The substrate array 5 includes a plurality of substrate 100' (as shown in FIG. 6B). Each substrate 100' includes an encapsulant 11', a release layer 320, and a carrier 300. The encapsulant 11' is attached to the carrier 300 via the release layer 320. The release layer 320 is covered by the encapsulant 11'. The release layer 320 is embedded in the encapsulant 11'. The carrier 300 serves to support the encapsulant 11'. In some embodiments, a plurality of the encapsulants 11' of the substrates 100' can be pre-designed or pre-molded. The carrier 300 may be recyclable. The volume of the encapsulant 11' can be designed as a minimum or reduced volume to reduce manufacturing cost.

The encapsulant 11' includes the surface 111', the surface 112', the lateral surface 113', and the sidewall 114'. The sidewall 114' may be tapered from the surface 111' to the surface 112'. In some embodiments, the surface 112' of the encapsulant 11' may be grinded. The surface 112' of the encapsulant 11' may not be grinded. The encapsulant 11' defines a cavity 120'. The sidewall 114' of the encapsulant 11' and a top surface of the carrier 300 define the cavity or space 120'. The sidewall 114' of the encapsulant 11' and the top surface of the carrier 300 form an angle (θ) which is in a range from approximately 91° to approximately 125° or from approximately 91° to approximately 115°.

FIG. 6B illustrates a perspective view of the substrate array 5 according to some embodiments of the present disclosure. The substrate array 5 includes the plurality of substrates 100'. Each substrate 100' includes the encapsulant 11', the release layer 320, and the carrier 300. The encapsulant 11' is attached to the carrier 300 via the release layer 320. In some embodiments, the encapsulant 11' may include a polyimide, a molding compound, a ceramic material, a conductive material, a metallic alloy, or other suitable materials. In some embodiments, the release layer 320 may be a thermal release film or an UV light release film. The release layer 320 may be a tape, a glue, or an adhesive.

Figure 6C:
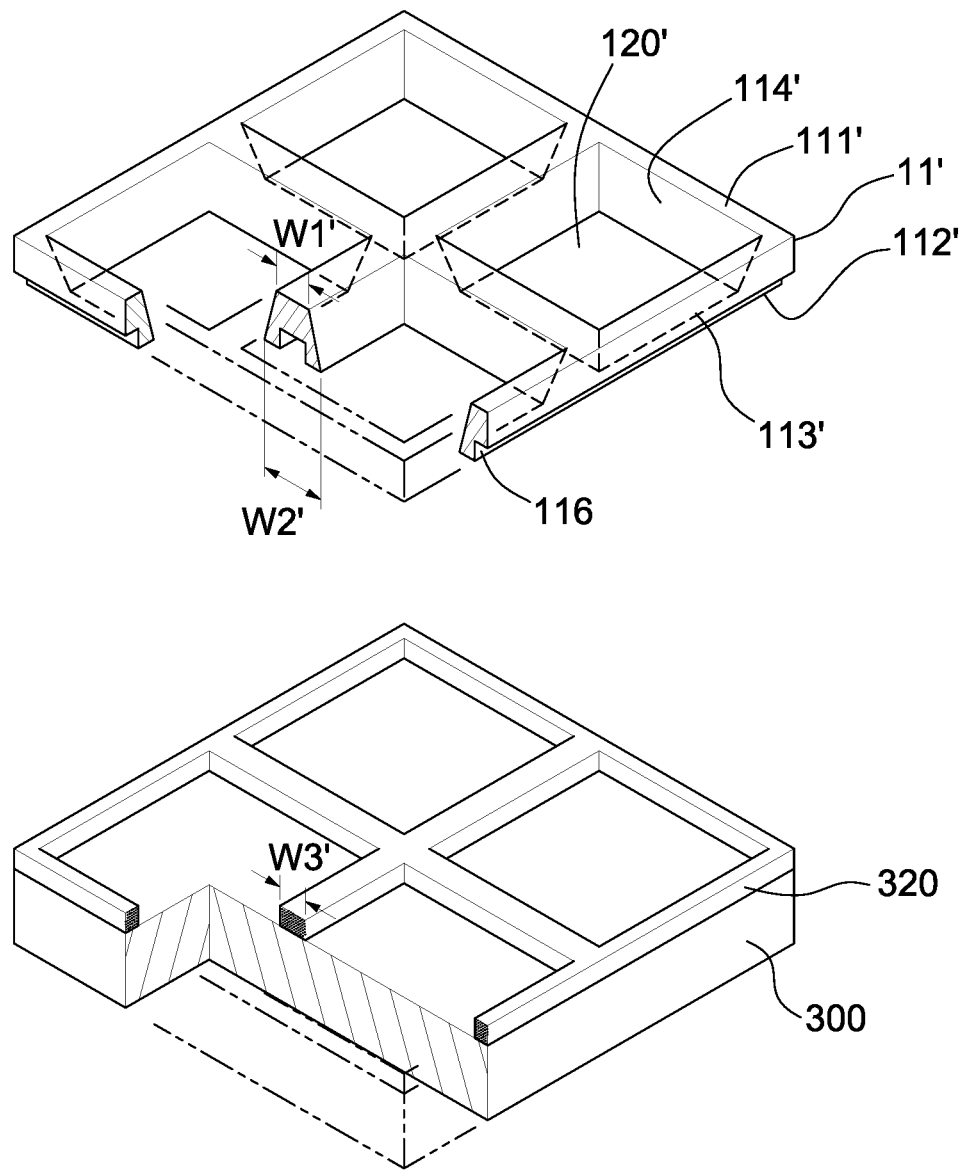
FIG. 6C illustrates an exploded perspective view of a substrate array according to some embodiments of the present disclosure.

FIG. 6C illustrates an exploded perspective view of the substrate array 5 according to some embodiments of the present disclosure. The substrate array 5 is divided into the encapsulant portion and the release layer portion with the carrier 300. The release layer 320 is disposed on the carrier 300.

For the encapsulant 11' of the substrate 100', the surface 111' of the encapsulant 11' has a width W1'. The surface 112' of the encapsulant 11' has a width W2'. The width W2' is larger than the width W1'. The release layer 320 is disposed on the carrier 300. The release layer 320 has a width W3'. In some embodiments, the width W3' is less than the width W2'.

Figure 6D:
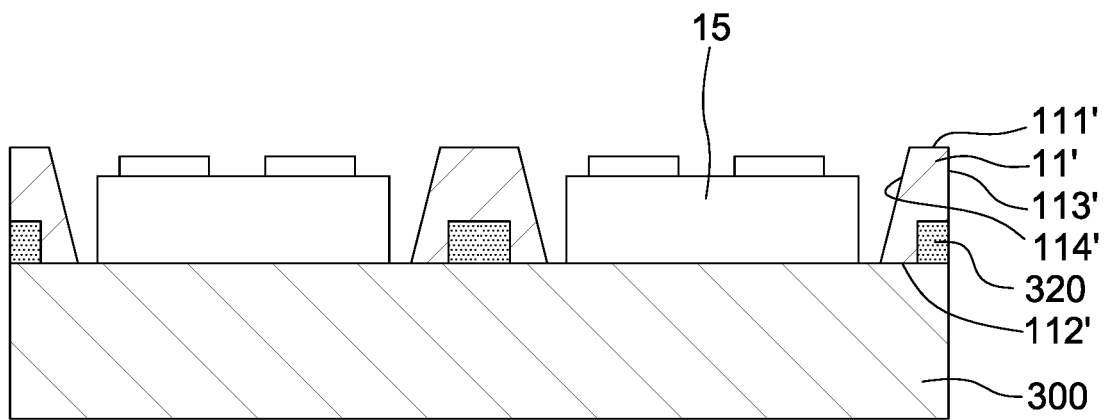
FIG. 6D illustrates a method of manufacturing a semiconductor device package according to some embodiments of the present disclosure.

Referring to FIG. 6D, the semiconductor device 15 is disposed into the cavity 120' of the encapsulant 11'. While disposing the semiconductor device 15 on the top surface of the carrier 300, the tapered sidewall 114' may help to guide the semiconductor device 15 to the top surface of the carrier 300 to avoid a misalignment or die-shift issue. The semiconductor device 15 can be directly disposed on the top surface of the carrier 300.

Figure 6E:
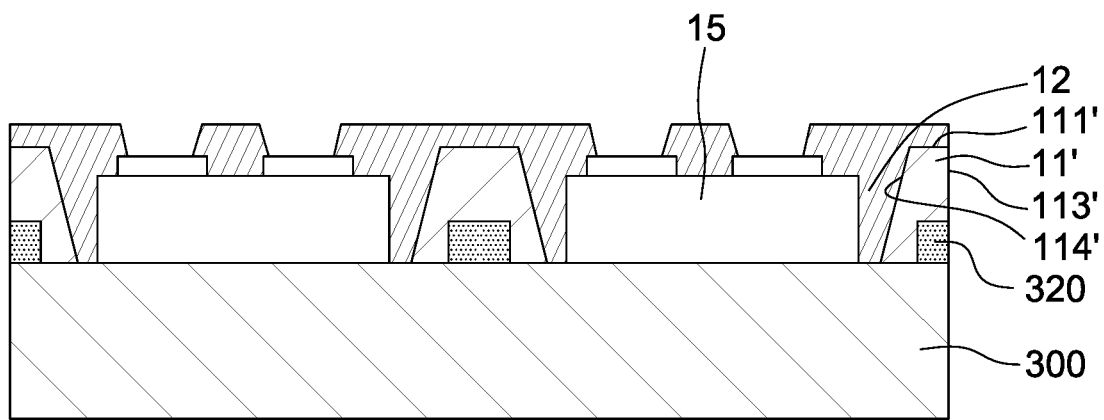
FIG. 6E illustrates a method of manufacturing a semiconductor device package according to some embodiments of the present disclosure.
Figure 6F:
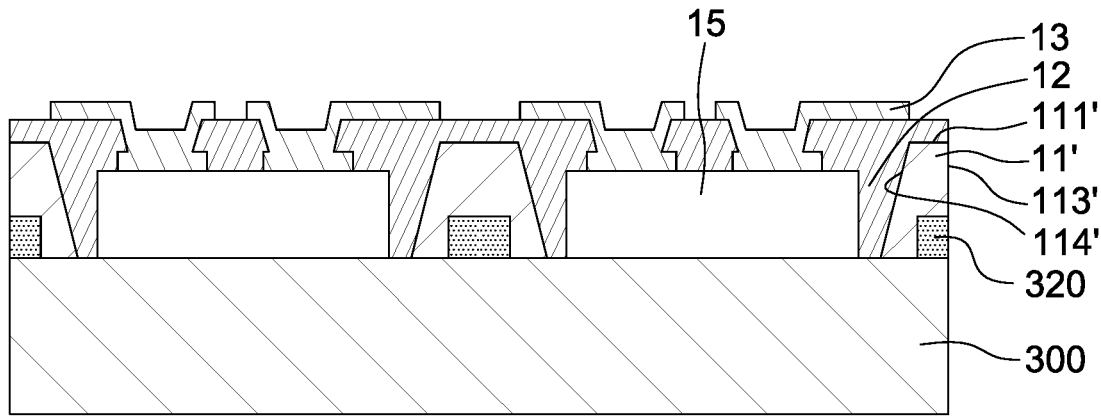
FIG. 6F illustrates a method of manufacturing a semiconductor device package according to some embodiments of the present disclosure.
Figure 6G:
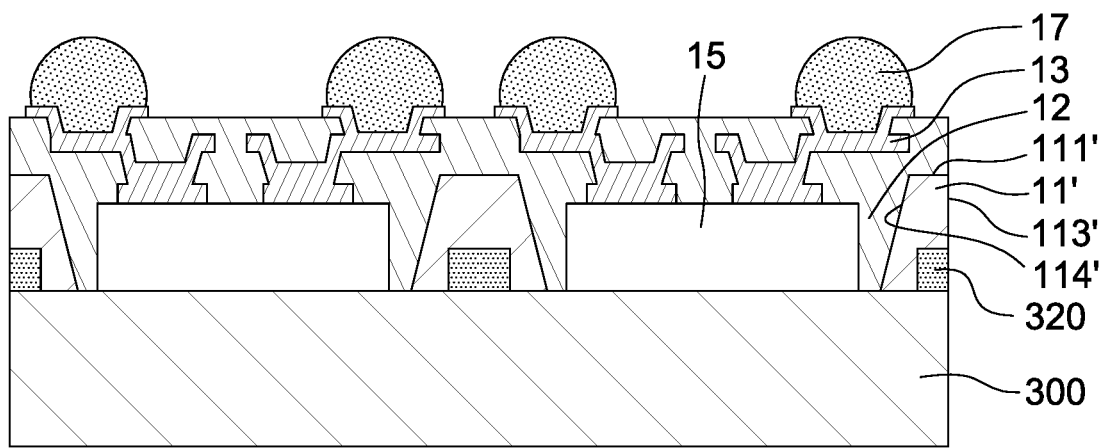
FIG. 6G illustrates a method of manufacturing a semiconductor device package according to some embodiments of the present disclosure.

Referring to FIG. 6E through FIG. 6G, the depicted operations are similar to the operations of FIG. 4C through FIG. 4F. Referring to FIG. 6E, the encapsulant 12 is formed to cover the encapsulant 11' and the semiconductor device 15. The encapsulant 12 is formed as a planarization layer. The quantity of the encapsulant 12 can be controlled as a relatively lesser quantity. In some embodiments, material characteristics of the encapsulant 11' can be relatively hard, as compared to, for example, the encapsulant 12. The encapsulant 11' may comprise a molding compound with a relatively higher amount of fillers. The encapsulant 11' may comprise a polyimide. The warpage issue can be mitigated because the encapsulant 11' can be relatively hard and the quantity of the encapsulant 12 formed in the cavity 120' is relatively less. In some embodiments, the encapsulant 12 may comprise a polyimide. The substrate 100' can act as a mold chase. Accordingly, another mold chase may be omitted. Since the encapsulant 11' may comprise a molding compound with a relatively high amount of fillers and the encapsulant 11' can be relatively hard, a rigidity of the encapsulant 11' is sufficient high to support the encapsulant 12 so as to enhance the rigidity of the whole package.

Referring to FIG. 6F, the redistribution layer 13 is formed on the encapsulant 12.

Referring to FIG. 6G, an additional portion of the encapsulant 12 is further formed on the redistribution layer 13 and covers the redistribution layer 13. Then, the additional portion of the encapsulant 12 is patterned to expose the redistribution layer 13. An additional redistribution layer 13 is further formed on the encapsulant 12. The redistribution layer 13 is surrounded by the encapsulant 12. The connection element 17 is disposed on the redistribution layer 13. The redistribution layer 13 is electrically connected to the semiconductor device 15. The connection element 17 is electrically connected to the semiconductor device 15.

Figure 6H:
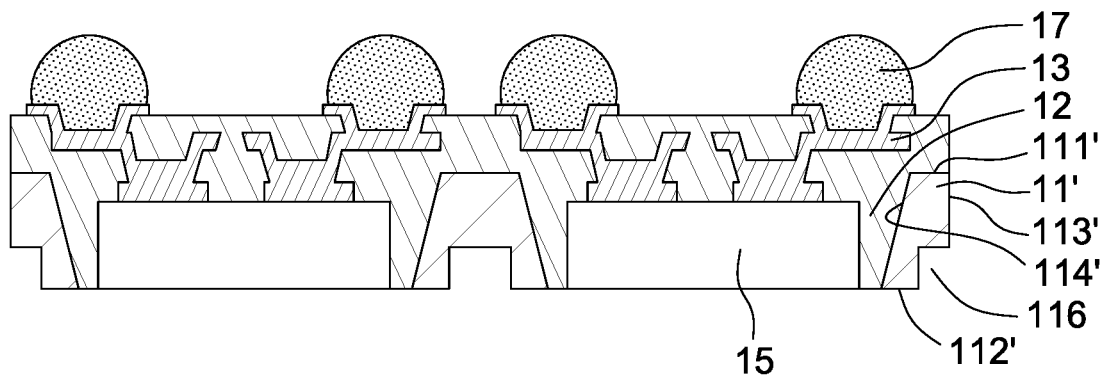
FIG. 6H illustrates a method of manufacturing a semiconductor device package according to some embodiments of the present disclosure.

Referring to FIG. 6H, the release layer 320 and the carrier 300 are removed to form the recesses 116 of the encapsulant 11'. The encapsulant 11' defines the recesses 116.

The semiconductor device package 3 depicted in FIG. 3 is then formed if the structure depicted in FIG. 6H is singulated by a singulation operation.

Figure 7A:
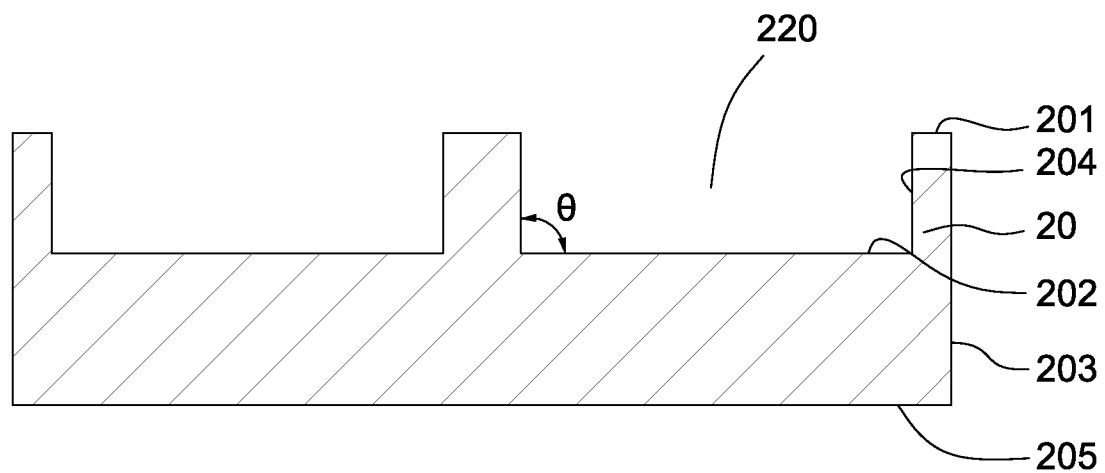
FIG. 7A illustrates a cross-sectional view of a comparative encapsulant according to some embodiments of the present disclosure.

FIG. 7A illustrates a cross-sectional view of a comparative encapsulant 20 according to some embodiments of the present disclosure.

The encapsulant 20 includes a surface 201, a surface 202, a surface 205, a lateral surface 203, and a sidewall 204. The surface 201 is opposite to the surface 205. The surface 201 is opposite to the surface 202. The lateral surface 203 extends between the surface 201 and the surface 205. The sidewall 204 extends between the surface 201 and the surface 202.

Figure 7B:
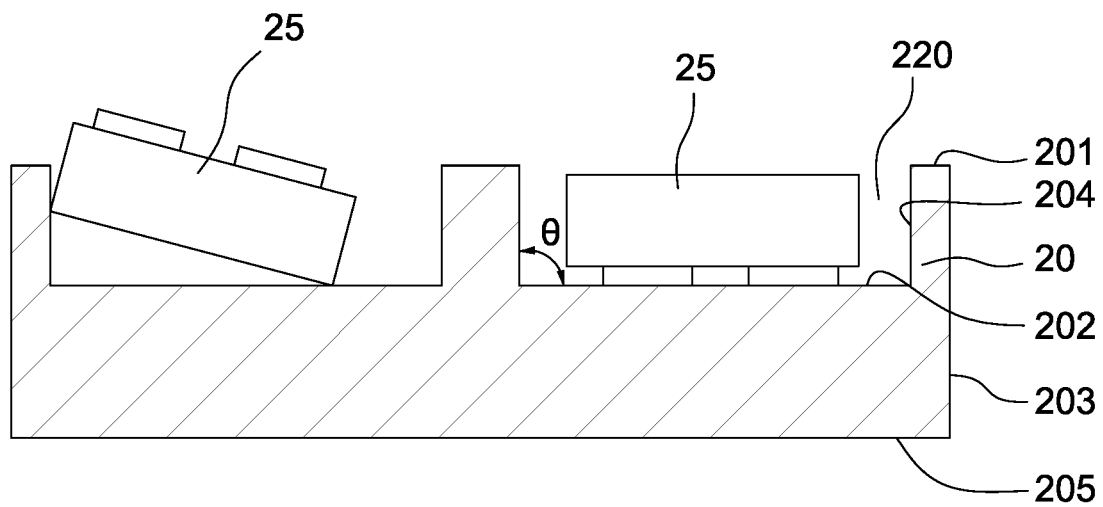
FIG. 7B illustrates a cross-sectional view of a comparative encapsulant with a semiconductor device thereon according to some embodiments of the present disclosure.

The sidewall 204 and the surface 202 define a space or a cavity 220 to accommodate or receive a semiconductor device 25 (as shown in FIG. 7B). The sidewall 204 is substantially perpendicular to the surface 202.

FIG. 7B illustrates a cross-sectional view of the comparative encapsulant 20 with a semiconductor device 25 thereon according to some embodiments of the present disclosure.

While disposing the semiconductor device 25 on the surface 202 of the encapsulant 20, since the sidewall 204 is substantially perpendicular to the surface 202 and is not conducive towards helping to guide the semiconductor device 25 to the surface 202, the semiconductor device 25 may be in a tilted position with one edge resting on the surface 202 and one edge against the sidewall 204 due to a misalignment or die-shift issue. In a worst case, the semiconductor device 25 may flip on the surface 202 of the encapsulant 20. Accordingly, the misalignment or die-shift issue may result in a failure for packaging the semiconductor device 25.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
   a semiconductor device including a top surface and a lateral surface;
   a first encapsulant layer comprising a top surface and a tapered sidewall and surrounding the semiconductor device;
   a second encapsulant layer in contact with the top surface and the lateral surface of the semiconductor device and the top surface and the tapered sidewall of the first encapsulant layer;
   a redistribution layer extending through the second encapsulant layer and electrically connected to the semiconductor device, the redistribution layer including a patterned conductive layer adjacent to a top surface of the second encapsulant layer, and
   a connection element disposed on the patterned conductive layer,
   wherein the tapered sidewall of the first encapsulant layer surrounds the semiconductor device and forms an obtuse angle with a bottom surface of the semiconductor device,
   wherein the patterned conductive layer of the redistribution layer has a recess with a first surface and a second surface lower than the first surface, and the second surface of the recess is lower than the top surface of the second encapsulant layer, and
   wherein the connection element is a solder ball, and a portion of the connection element is lower than the top surface of the second encapsulant layer.

2. The semiconductor device package of claim 1, wherein the first encapsulant layer surrounds the second encapsulant layer.

3. The semiconductor device package of claim 1, wherein the redistribution layer is surrounded by the second encapsulant layer.

4. The semiconductor device package of claim 1, wherein the first encapsulant layer comprises a first surface and a second surface substantially perpendicular to the first surface, and wherein a roughness of the first surface is greater than a roughness of the second surface.

5. The semiconductor device package of claim 1, wherein the semiconductor device is exposed by the second encapsulant layer.

6. The semiconductor device package of claim 1, wherein the second encapsulant layer includes a bottom surface, and wherein the tapered sidewall of the first encapsulant layer and the bottom surface of the second encapsulant layer form an angle in a range from approximately 91° to approximately 115°.

7. The semiconductor device package of claim 1, wherein the semiconductor device has a bottom surface, and the bottom surface of the semiconductor device is exposed by the second encapsulant layer.

8. The semiconductor device package of claim 1, wherein the first encapsulant layer comprises a step structure.

9. The semiconductor device package of claim 1, wherein the second encapsulant layer is a planarization layer.

10. The semiconductor device package of claim 9, wherein the planarization layer comprises polyimide.

11. The semiconductor device package of claim 1, wherein the patterned conductive layer is disposed on a projection area of the tapered sidewall of the first encapsulant layer.

12. The semiconductor device package of claim 11, wherein the patterned conductive layer laterally extends over the projection area of the tapered sidewall of the first encapsulant layer.

13. The semiconductor device package of claim 11, wherein the connection element is vertically aligned with the projection area of the tapered sidewall of the first encapsulant layer.

14. The semiconductor device package of claim 1, wherein the redistribution layer is disposed in the second encapsulant layer.

15. The semiconductor device package of claim 14, wherein a portion of the redistribution layer is exposed from the second encapsulant layer.

16. The semiconductor device package of claim 15, wherein the redistribution layer comprises conductive traces, pads and vias.

17. A semiconductor device package, comprising:
   a semiconductor device including a top surface and a lateral surface;
   a first encapsulant layer comprising a top surface and a tapered sidewall and surrounding the semiconductor device;
   a second encapsulant layer in contact with the top surface and the lateral surface of the semiconductor device and the top surface and the tapered sidewall of the first encapsulant layer; and
   a redistribution layer extending through the second encapsulant layer and electrically connected to the semiconductor device, the redistribution layer including a patterned conductive layer adjacent to a top surface of the second encapsulant layer,
   wherein the tapered sidewall of the first encapsulant layer surrounds the semiconductor device and forms an obtuse angle with a bottom surface of the semiconductor device,
   wherein the patterned conductive layer of the redistribution layer has a recess with a first surface and a second surface lower than the first surface, and the second surface of the recess is lower than the top surface of the second encapsulant layer,
   wherein the semiconductor device includes a conductive pad protruding from the top surface of the semiconductor device, and the conductive pad of the semiconductor device is lower than the top surface of the first encapsulant layer.

* * * * *